(12) United States Patent
Paul et al.

(10) Patent No.: US 10,340,939 B1
(45) Date of Patent: Jul. 2, 2019

(54) SUCCESSIVE APPROXIMATION REGISTER ANALOG-TO-DIGITAL CONVERTER WITH KICKBACK LINEARIZATION

(71) Applicant: TEXAS INSTRUMENTS INCORPORATED, Dallas, TX (US)

(72) Inventors: Sabu Paul, Bengaluru (IN); Raghu Nandan Srinivasa, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/974,752

(22) Filed: May 9, 2018

(51) Int. Cl.
*H03M 1/46* (2006.01)
*H03M 1/80* (2006.01)

(52) U.S. Cl.
CPC .......... *H03M 1/468* (2013.01); *H03M 1/802* (2013.01)

(58) Field of Classification Search
None
See application file for complete search history.

(56) References Cited

U.S. PATENT DOCUMENTS

| | | | |
|---|---|---|---|
| 6,600,437 B1 * | 7/2003 | Confalonieri | H03M 1/68 341/150 |
| 9,391,627 B1 * | 7/2016 | Srinivasa | H03M 1/466 |
| 2012/0075128 A1 * | 3/2012 | Aruga | H03M 1/1038 341/110 |

* cited by examiner

*Primary Examiner* — Howard Williams
(74) *Attorney, Agent, or Firm* — John R. Pessetto; Charles A. Brill; Frank D. Cimino

(57) ABSTRACT

A successive approximation register analog-to-digital converter with improved kick-back linearization includes a signal input terminal, a capacitive digital-to-analog converter, a first switch, and a second switch. The signal input terminal is configured to receive a signal to be digitized. The capacitive digital-to-analog converter includes a first capacitor array, a second capacitor array, and a coupling capacitor. The first capacitor array includes a plurality of capacitors. The second capacitor array includes a plurality of capacitors. The coupling capacitor connects the first capacitor array to the second capacitor array. The first switch is configured to switchably connect a bottom plate of each of the capacitors of the first capacitor array to the signal input terminal. The second switch is configured to conduct a voltage on the bottom plate of the coupling capacitor to the signal input terminal.

19 Claims, 4 Drawing Sheets

SUCCESSIVE APPROXIMATION REGISTER ANALOG-TO-DIGITAL CONVERTER WITH KICKBACK LINEARIZATION

BACKGROUND

Various analog-to-digital data converters and conversion techniques are available for converting electrical signals from an analog domain to a digital domain. In general, the process of analog-to-digital conversion includes sampling an analog signal and comparing the sampled analog signal to a threshold value. A binary result is recorded depending upon the result of the comparison. The process of comparing the sample to a threshold may be repeated a number of times with each successive comparison using a different threshold and residue of the sample. The number of iterations typically affects the noise level of any result as well as the resolution of the ultimate digital signal.

The successive approximation register (SAR) converter is one example of an analog-to-digital converter (ADC). The SAR ADC performs a binary search for the digital value that best corresponds to the voltage of an analog signal. In a SAR ADC, a voltage input is compared with one half of a voltage reference. If the voltage input is greater than one half of the voltage reference, a logic '1' is stored in a register. Alternatively, if the voltage input is less than one half of the voltage reference, a logic '0' is stored in the register. Next, if the previous comparison indicated that voltage input is greater than one half of the voltage reference, the voltage input is compared with three-quarters of the voltage reference. Again, where the comparison indicates a greater than condition, then a logic '1' is stored in the register. In contrast, if the comparison indicates a less than condition, then a logic '0' is stored in the register. Alternatively, if the previous comparison indicated that voltage input is less than one half of the voltage reference, then voltage input is compared with one quarter of the voltage reference. Again, if the comparison indicates a greater than condition, then a logic '1' is stored in the register. In contrast, if the comparison indicates a less than condition, then a logic '0' is stored in the register. This process is continued for lower order multiples of the voltage reference. As will be appreciated, the aforementioned process is capable of providing an ADC result with high resolution in a relatively small amount of time. In particular, only a single iteration can produce each bit of resolution. For example, for a ten bit resolution only ten iterations are required, and for twenty bits of resolution only twenty iterations are required.

SUMMARY

A successive approximation register (SAR) analog-to-digital converter (ADC) with improved kick-back linearization is disclosed herein. In one example, a SAR ADC includes a signal input terminal, a capacitive digital-to-analog converter, a first switch, and a second switch. The signal input terminal is configured to receive a signal to be digitized. The capacitive digital-to-analog converter includes a first capacitor array, a second capacitor array, and a coupling capacitor. The first capacitor array includes a plurality of capacitors. The second capacitor array includes a plurality of capacitors. The coupling capacitor connects the first capacitor array to the second capacitor array. The coupling capacitor includes a top plate connected to a top plate of each of the capacitors of the first capacitor array, and a bottom plate connected to a top plate of each of the capacitors of the second capacitor array. The first switch is configured to switchably connect a bottom plate of each of the capacitors of the first capacitor array to the signal input terminal. The second switch is configured to conduct a voltage on the bottom plate of the coupling capacitor to the signal input terminal.

In another example, a SAR ADC includes a signal input terminal, a capacitive digital-to-analog converter, a first switch, and a second switch. The signal input terminal is configured to receive a signal to be digitized. The capacitive digital-to-analog converter includes a first capacitor array, a second capacitor array, and a coupling capacitor. The first capacitor array includes a plurality of capacitors. The second capacitor array includes a plurality of capacitors. The coupling capacitor connects the first capacitor array to the second capacitor array. The coupling capacitor includes a top plate connected to a top plate of each of the capacitors of the first capacitor array, and a bottom plate connected to a top plate of each of the capacitors of the second capacitor array. The first switch is configured to switchably connect a bottom plate of each of the capacitors of the first capacitor array to the signal input terminal. The second switch is configured to switchably connect the bottom plate of the coupling capacitor and a top plate of each of the capacitors of the second capacitor array to ground.

In a further example, a SAR ADC includes a signal input terminal, a capacitive digital-to-analog converter, a first switch, and a second switch. The signal input terminal is configured to receive a signal to be digitized. The capacitive digital-to-analog converter includes a first capacitor array and a second capacitor array. The first capacitor array includes a plurality of capacitors that are binary weighted to represent most significant bits of a digital value. The second capacitor array includes a plurality of capacitors that are binary weighted to represent least significant bits of a digital value. The first switch is configured to switchably connect a bottom plate of each of the capacitors of the first capacitor array to the signal input terminal. The second switch is configured to conduct a voltage on a top plate of each of the capacitors of the second capacitor array to the signal input terminal.

BRIEF DESCRIPTION OF THE DRAWINGS

For a detailed description of various examples, reference will now be made to the accompanying drawings in which.

DETAILED DESCRIPTION

Figure 1:
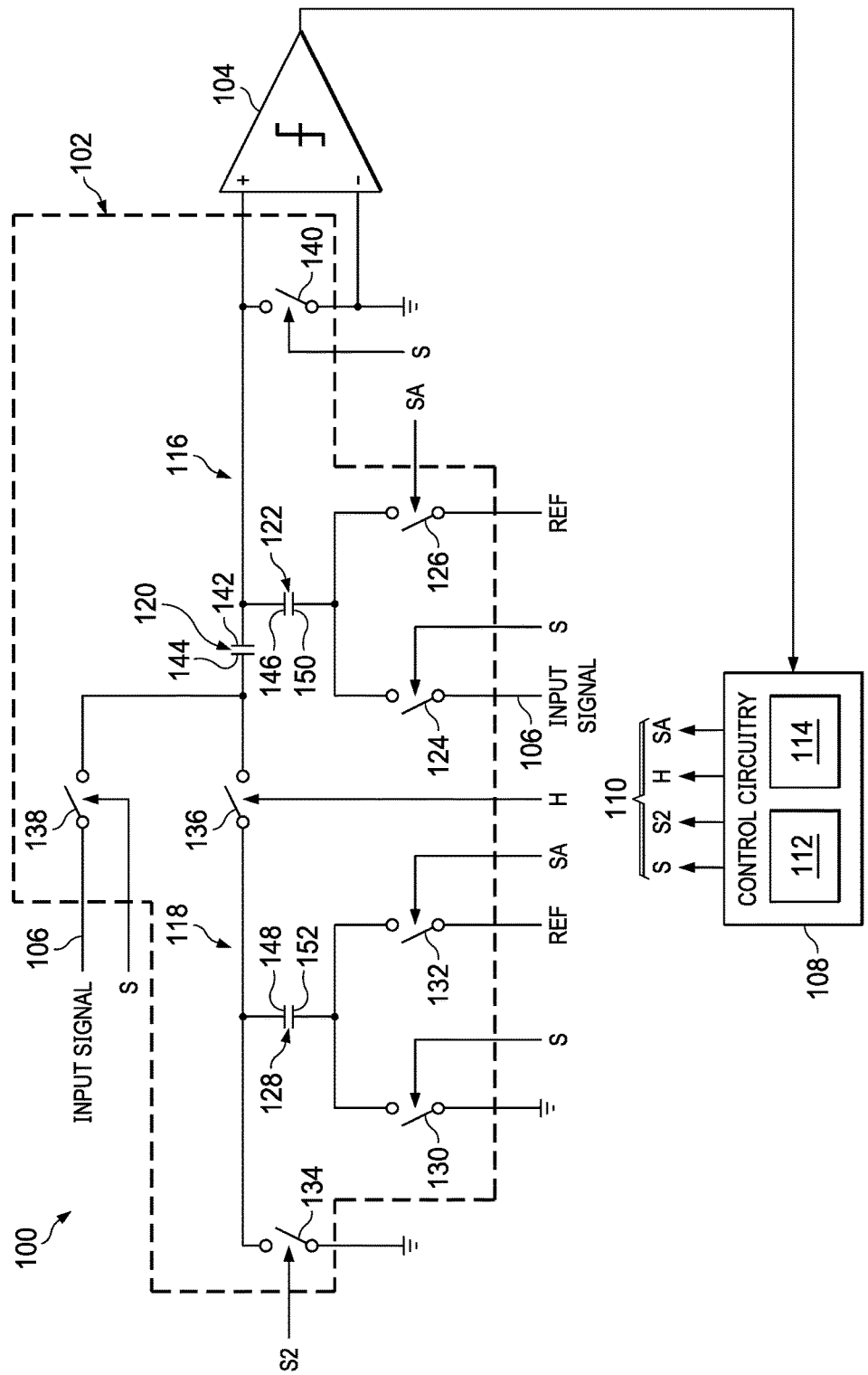
FIG. 1 shows a block diagram of a first example of a successive approximation register (SAR) analog-to-digital converter (ADC) with improved kick-back linearity in accordance with the present disclosure.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Successive approximation register (SAR) analog-to-digital converters (ADCs), while efficient, are not without issues. For example, sampling linearity may be poor when a SAR ADC implemented with a capacitive digital-to-analog converter (CDAC) is driven by a high impedance source. When the SAR ADC is sampling an input signal, the capacitors of the CDAC are connected to the signal input (i.e., to the signal source). The voltage on the capacitors is an approximation of the last sampled input voltage. The error in the voltage is equivalent to the last sampled input voltage less the voltage represented by the digital value assigned to the CDAC to convert the input signal to a digital value ($V_{IN}$-$V_{DAC}$). Thus, the input signal source must supply $V_{IN}$-$V_{DAC}$ to compensate for the kick-back from the CDAC. Inability of the input signal source to compensate, within the sampling time, for the kick-back limits the sampling linearity of the SAR ADC.

Various techniques for improving kick-back linearity have been implemented. For example, some SAR ADCs include an input driver that compensates for the kick-back. However, the driver consumes power and circuit area, and can inject noise and non-linearity, and/or limit signal swing. Some SAR ADCs reset the bottom plates of the CDAC capacitors prior to sampling the input signal, which requires large shorting switches. The time needed to reset the capacitors reduces the time available for sampling or digitizing the input signal, and in turn increases conversion time.

The SAR ADCs disclosed herein provide improved kick-back linearity by reducing the difference in the last sampled input voltage and the voltage presented to the input source when acquiring a new sample. The SAR ADCs of the present disclosure include a split CDAC having a most significant bit (MSB) capacitor array and a least significant bit (LSB) capacitor array connected by a coupling capacitor. At completion of sample digitization, the voltage on the bottom plates of the MSB capacitor array is switched to the converter's input terminal. The voltage on the bottom plates of the MSB capacitor array is $V_{DACMSB}$, and the charge on the MSB capacitor array is:

$$V_{DACMSB} C_{DACMSB}$$

where $C_{DACMSB}$ is the capacitance of the MSB capacitor array.

The voltage on the top plates of the LSB capacitor array and the bottom plate of the coupling capacitor is:

$$\frac{(V_{IN} - V_{DACMSB}) C_{DACMSB}}{C_{CC}},$$

where $C_{CC}$ is the capacitance of the coupling capacitor. Thus, the charge on the coupling capacitor is:

$$\frac{(V_{IN} - V_{DACMSB}) C_{DACMSB} C_{CC}}{C_{CC}} = (V_{IN} - V_{DACMSB}) C_{DACMSB}$$

The total charge on the MSB capacitor array and the coupling capacitor is:

$$(V_{IN} - V_{DACMSB}) C_{DACMSB} + V_{DACMSB} C_{DACMSB} = V_{IN} C_{DACMSB},$$

and all charge on the MSB capacitor array acquired from the last sampled input voltage is preserved.

Implementations of the SAR ADCs disclosed herein switchably conduct the voltage on bottom plates of the MSB capacitor array and the voltage on the bottom plate of the coupling capacitor (i.e., the voltage on the top plates of the LSB capacitor array) to the input terminal while sampling the input voltage. By switching the voltage on the coupling capacitor bottom plate in addition to the voltage on the MSB capacitor array bottom plates to the input terminal, the SAR ADCs disclosed herein cancel the non-linear component of the charge kicked back by the MSB capacitor array so that the linearity performance of the SAR ADC not sensitive to the bandwidth and impedance of the circuit driving the input of the SAR ADC.

FIG. 1 shows a block diagram of a first example of a SAR ADC 100 with improved kick-back linearity in accordance with the present disclosure. The SAR ADC 100 includes a CDAC 102, a comparator 104, a signal input terminal 106, and control circuitry 108. The SAR ADC 100 receives an input signal ($V_{IN}$) to be digitized via the signal input terminal 106. The comparator 104 compares the voltage output of the CDAC 102 to a reference voltage. The control circuitry 108 receives and applies the output of the comparator 104 to control the CDAC 102 for execution of a binary search for a digital value best representing the input signal. The control circuitry 108 includes a SAR 112 and state machine circuitry 114. The SAR 112 generates control signals 110 that control the switches of the CDAC 102.

The CDAC 102 includes an MSB capacitor array 116, an LSB capacitor array 118, and a coupling capacitor 120. The MSB capacitor array 116 includes a plurality of binary weighted capacitors 122, sampling switches 124, selection switches 126, and a top plate reset switch 140. The top plate reset switch 140 switchably connects the top plates 146 of the binary weighted capacitors 122 to ground. The coupling capacitor 120 connects the MSB capacitor array 116 to the LSB capacitor array 118. The top plate 142 of the coupling capacitor 120 is connected to the top plates 146 of the binary weighted capacitors 122.

Figure 2:
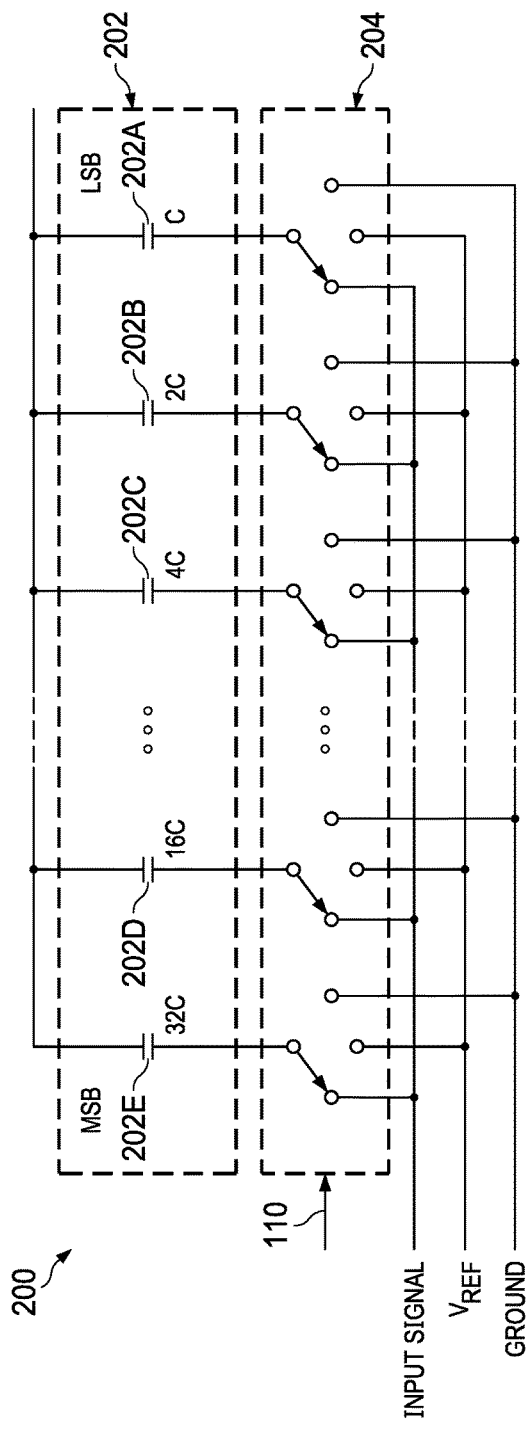
FIG. 2 shows a schematic diagram of an example of capacitor array and switches for implementation of a split capacitive digital-to-analog converter (DAC) of a SAR ADC with improved kick-back linearity in accordance with the present disclosure.

FIG. 2 shows a schematic diagram of a portion of a capacitor array 200 for use in a split CDAC 102. The capacitor array 200 is be an implementation of the binary weighted capacitors 122, the sampling switches 124 and the selection switches 126. The capacitor array 200 includes binary weighted capacitors 202 and switches 204. In the capacitor array 200, the capacitor 202A has capacitance C and corresponds to the LSB of the capacitor array 200. Each successive capacitor of the capacitor array 200 has double the capacitance of the capacitor corresponding to the next lower bit. Accordingly, capacitor 202B has capacitance 2C, capacitor 202C has capacitance 4C, capacitor 202D has capacitance 16C, and capacitor 202E has capacitance 32C. The capacitors 202 are coupled to switches 204 that switchably connect the bottom plates of the capacitors 202 to the signal input terminal 106 or to a reference voltage source (e.g., $V_{REF}$ or ground). In some examples, each switch 204 is be implemented as three switches. For example, a first switch connects the bottom plate of the capacitor 202A to the signal input terminal 106, a second switch connects the bottom plate of the capacitor 202A to ground, and a third switch connects the bottom plate of the capacitor 202A to $V_{REF}$.

The control signals 110 generated by the control circuitry 108 connect the capacitors 202 to the signal input terminal 106 to capture a sample of the input signal, and thereafter in N conversion cycles the control signals 110 successively switch each capacitor 202 to $V_{REF}$ and/or ground to perform a binary search for the N-bit digital value that best represents the sample of the input signal.

Returning now to FIG. 1, the LSB capacitor array 118 includes a plurality of binary weighted capacitors 128, sampling switches 130, selection switches 132, a top plate reset switch 134, an isolation switch 136, and an input connection switch 138. The top plate reset switch 134 switchably connects the top plates 148 of the binary weighted capacitors 128, and the bottom plate 144 of the coupling capacitor 120, to ground. The isolation switch 136 switchably connects the bottom plate 144 of the coupling capacitor 120 to the top plates 148 of the binary weighted capacitors 128. The input connection switch 138 switchably connects the bottom plate 144 of the coupling capacitor 120 to the signal input terminal 106. The capacitor array 200, shown in FIG. 2, is an implementation of the binary weighted capacitors 128, the sampling switches 130, and the selection switches 132.

The control signals 110 generated by the control circuitry 108 include sampling (S) control signal, sampling (S2) control signal, hold (H) control signal, and successive approximation (SA) control signals. The S control signal controls the switching of the sampling switches 124, the top plate reset switch 140, the sampling switches 130, and the input connection switch 138. The S2 control signal controls the switching of the top plate reset switch 134, the H control signal controls the switching of the isolation switch 136, and the SA control signals control the switching of the selection switches 126 and the selection switches 132. To acquire a sample of the input signal present at the signal input terminal 106, the control circuitry 108 opens the selection switches 126, the selection switches 132, and the isolation switch 136, and closes the sampling switches 124, the sampling switches 130, the top plate reset switch 134, and the input connection switch 138. Closing the sampling switches 124 connects the bottom plates 150 of the binary weighted capacitors 122 to the signal input terminal 106. Closing the input connection switch 138 connects the bottom plate 144 of the coupling capacitor 120 to the signal input terminal 106. Thus, during sampling of the input signal at the signal input terminal 106, the voltage on the bottom plates 150 of the binary weighted capacitors 122 and the voltage on the bottom plate 144 of the coupling capacitor 120 is connected to the signal input terminal 106. The voltage on the bottom plate 144 of the coupling capacitor 120 ($V_{IN}$-$V_{MSB}$) compensates for the non-linear voltage on the bottom plates 150 of the binary weighted capacitors 122 ($V_{MSB}$) to linearize the kick-back presented to the signal input terminal 106 during sampling.

Figure 3:
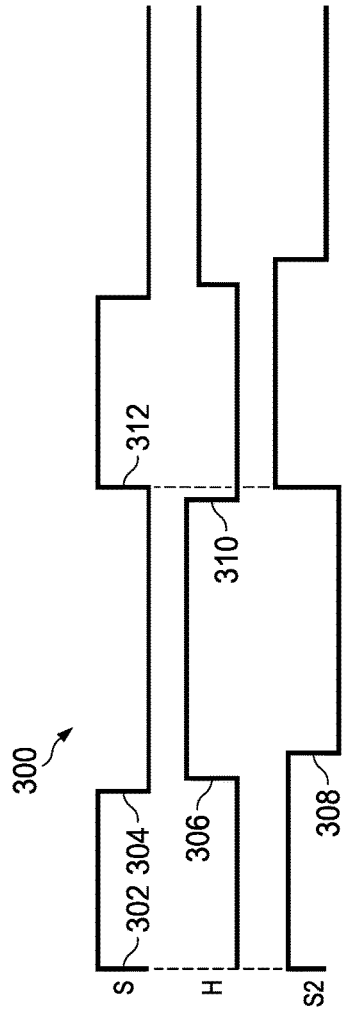
FIG. 3 shows a timing diagram for an example of signals generated by control circuitry of a SAR ADC with improved kick-back linearity in accordance with the present disclosure.

FIG. 3 shows a timing diagram 300 for an example of the control signals 110 generated by the control circuitry 108 in accordance with the present disclosure. At 302, the H control signal is already reset to disconnect the binary weighted capacitors 128 from the coupling capacitor 120, and the S control signal is set to connect the bottom plates 150 of the binary weighted capacitors 122 and the coupling capacitor 120 to the signal input terminal 106, to connect the top plates 146 of the binary weighted capacitors 122 to ground, and to connect the bottom plates 152 of the binary weighted capacitors 128 to ground. The S2 control signal is set to connect the top plates 148 of the binary weighted capacitors 128 to ground. While S is set, the binary weighted capacitors 122 acquire a sample of the input signal at the signal input terminal 106, and the binary weighted capacitors 128 are discharged.

At 304, the S control signal is reset to disconnect the bottom plates 150 of the binary weighted capacitors 122 and the coupling capacitor 120 from the signal input terminal 106, to disconnect the top plates 146 of the binary weighted capacitors 122 from ground, and to disconnect the bottom plates 152 of the binary weighted capacitors 128 from ground. The charge on the binary weighted capacitors 122 is representative of the input signal at the signal input terminal 106.

At 306, the H control signal is set to close the isolation switch 136 and connect the top plates 148 of the binary weighted capacitors 128 and the top plate reset switch 134 to the bottom plate 144 of the coupling capacitor 120. At 306, the S2 control signal remains set, and the bottom plate 144 of the coupling capacitor 120 is connected to ground via the top plate reset switch 134.

At 308, the S2 control signal is reset to disconnect the top plates 148 of the binary weighted capacitors 128 and the bottom plate 144 of the coupling capacitor 120 from ground. While the H control signal remains set, the control circuitry 108 successively sets the SA control signals that drive the selection switches 126 and the selection switches 132 to perform a binary search for the value of the SA control signals that represent a digital value closest to the voltage acquired by the binary weighted capacitors 122 while S was set.

At 310, digitization is complete and the voltage on the top plates 148 of the binary weighted capacitors 128 is the same as the voltage on the bottom plate 144 of the coupling capacitor 120. The SA control signals are reset to open the selection switches 126 and the selection switches 132. The H control signal is set to open the isolation switch 136 and disconnect the bottom plate 144 of the coupling capacitor 120 from the top plates 148 of the binary weighted capacitors 128.

At 312, acquisition of a new sample of the input signal at the signal input terminal 106 is initiated by setting the S control signal to connect the bottom plates 150 of the binary weighted capacitors 122 and the coupling capacitor 120 to the signal input terminal 106, to connect the top plates 146 of the binary weighted capacitors 122 to ground, and to connect the bottom plates 152 of the binary weighted capacitors 128 to ground. As the S control signal is set, the voltage on the bottom plate 144 of the coupling capacitor 120 is presented to the signal input terminal 106 in addition to the voltage on the bottom plates 150 of the binary weighted capacitors 122 to provide kick-back linearization.

Figure 4:
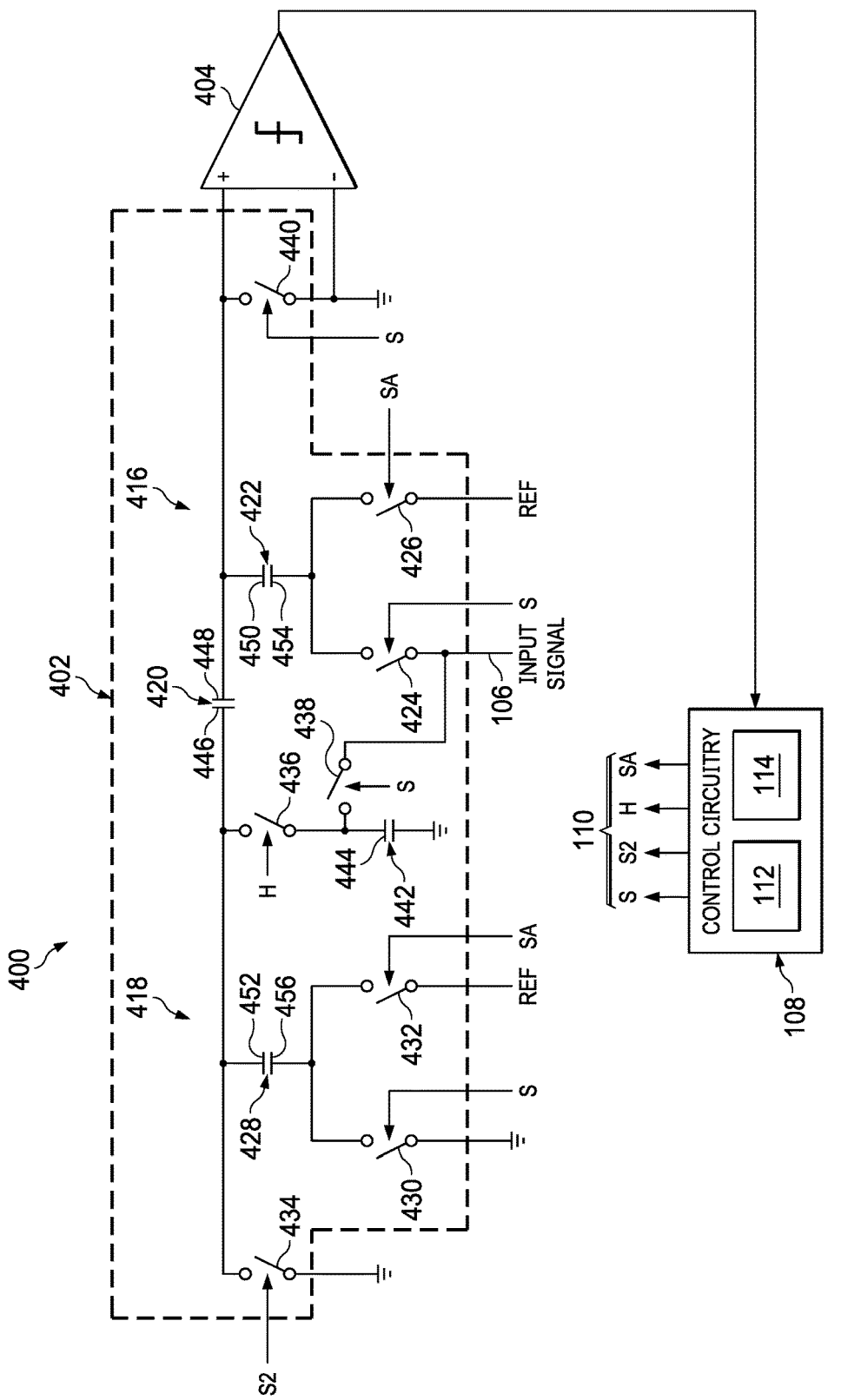
FIG. 4 shows a block diagram of a second example of a SAR ADC with improved kick-back linearity in accordance with the present disclosure.

FIG. 4 shows a block diagram of a second example of a SAR ADC 400 with improved kick-back linearity in accordance with the present disclosure. The SAR ADC 400 includes a CDAC 402, a comparator 404, a signal input terminal 106, and control circuitry 108. The SAR ADC 400 receives an input signal ($V_{IN}$) to be digitized via the signal input terminal 106. The comparator 404 compares the voltage output of the CDAC 402 to a reference voltage. The control circuitry 108 receives and applies the output of the comparator 404 to control the CDAC 402 for digitization of the input signal. The control circuitry 108 includes a SAR 112 and state machine circuitry 114. The state machine circuitry 114 generates control signals 110 that control the switches of the CDAC 402. The SAR ADC 400 is similar to the SAR ADC 100, but includes a sampling capacitor 442 that is switchably connected to the signal input terminal 106 instead of the bottom plate 446 of the coupling capacitor 420. At the end of digitization, the voltage on the top plate 444 of the sampling capacitor 442 is the same as the voltage on the bottom plate 446 of the coupling capacitor 420. Because the CDAC 402 includes no switches in the conductors between the binary weighted capacitors 428 and the coupling capacitor 420, the SAR ADC 400 may provide lower digitization time than the SAR ADC 100. The capacitance of the sampling capacitor 442 is the same as, or is proportional to, the capacitance of the coupling capacitor 420 in some implementations.

The CDAC 402 includes an MSB capacitor array 416, an LSB capacitor array 418, and the coupling capacitor 420. The MSB capacitor array 416 includes a plurality of binary weighted capacitors 422, sampling switches 424, selection switches 426, and a top plate reset switch 440. The top plate reset switch 440 switchably connects the top plates 452 of the binary weighted capacitors 422 to ground. The top plate 448 of the coupling capacitor 420 is connected to the top plates 450 of the binary weighted capacitors 422. The capacitor array 200 shown in FIG. 2 is an implementation of the binary weighted capacitors 422, the sampling switches 424 and the selection switches 426.

The LSB capacitor array 418 includes a plurality of binary weighted capacitors 428, sampling switches 430, selection switches 432, a top plate reset switch 434, a sampling capacitor 442, an isolation switch 436, and an input connection switch 438. The bottom plate 446 of the coupling capacitor 420 is connected to the top plates 452 of the capacitors 428. The top plate reset switch 434 switchably connects the top plates 452 of the binary weighted capacitors 428, the top plate 444 of the sampling capacitor 442, and the bottom plate 446 of the coupling capacitor 420 to ground. The isolation switch 436 switchably connects the top plate 444 of the sampling capacitor 442 to the top plates 452 of the binary weighted capacitors 428, and to the bottom plate 446 of the coupling capacitor 420. The input connection switch 438 switchably connects the top plate 444 of the sampling capacitor 442 to the signal input terminal 106. The capacitor array 200, shown in FIG. 2, is an implementation of the binary weighted capacitors 428, the sampling switches 430, and the selection switches 432.

The control signals 110 generated by the control circuitry 108 include sampling (S) control signal, sampling (S2) control signal, hold (H) control signal, and successive approximation (SA) control signals. The S control signal controls the switching of the sampling switches 424, the top plate reset switch 440, the sampling switches 430, and the input connection switch 438. The S2 control signal controls the switching of the top plate reset switch 434, the H control signal controls the switching of the isolation switch 436, and the SA control signals control the switching of the selection switches 426 and the selection switches 432. To acquire a sample of the input signal present at the signal input terminal 106, the control circuitry 108 opens the selection switches 426, the selection switches 432, and the isolation switch 436, and closes the sampling switches 424, the sampling switches 430, the top plate reset switch 434, and the input connection switch 438. Closing the sampling switches 424 connects the bottom plates 454 of the binary weighted capacitors 422 to the signal input terminal 106. Closing the input connection switch 438 connects the top plate 444 of the sampling capacitor 442 to the signal input terminal 106. Thus, during sampling of the input signal at the signal input terminal 106, the voltage on the bottom plates 454 of the binary weighted capacitors 422 and the voltage on the top plate 444 of the sampling capacitor 442 is connected to the signal input terminal 106. The voltage on the top plate 444 of the sampling capacitor 442 ($V_{IN}$-$V_{MSB}$) compensates for the voltage on the bottom plates 454 of the binary weighted capacitors 422 ($V_{MSB}$) to linearize the kick-back presented to the signal input terminal 106 during sampling.

Referring again to FIG. 3, the operation of the SAR ADC 400 is now described. At 302, the H control signal is already reset to disconnect the binary weighted capacitors 428 from the sampling capacitor 442, and the S control signal is set to concurrently connect the bottom plates 454 of the binary weighted capacitors 422 and the top plate 444 of the sampling capacitor 442 to the signal input terminal 106, to connect the top plates 450 of the binary weighted capacitors 422 to ground, and to connect the bottom plates 456 of the binary weighted capacitors 428 to ground. The S2 control signal is set to connect the top plates 452 of the binary weighted capacitors 428 to ground. While S is set, the binary weighted capacitors 422 acquire a sample of the input signal at the signal input terminal 106, and the binary weighted capacitors 428 are discharged.

At 304, the S control signal is reset to disconnect the bottom plates 454 of the binary weighted capacitors 422 and the top plate 444 of the sampling capacitor 442 from the signal input terminal 106, to disconnect the top plates 450 of the binary weighted capacitors 422 from ground, and to disconnect the bottom plates 456 of the binary weighted capacitors 428 from ground. The charge on the binary weighted capacitors 422 is representative of the input signal at the signal input terminal 106.

At 306, the H control signal is set to connect the top plates 452 of the binary weighted capacitors 428 and the bottom plate 446 of the coupling capacitor 420 to the top plate 444 of the sampling capacitor 442. At 306, the S2 control signal remains set, and the top plate 444 of the sampling capacitor 442 is connected to ground via the isolation switch 436 and the top plate reset switch 434.

At 308, the S2 control signal is reset to disconnect the top plates 452 of the binary weighted capacitors 428, the top plate 444 of the sampling capacitor 442, and the bottom plate 446 of the coupling capacitor 420 from ground. While the H control signal remains set, the control circuitry 108 successively sets the SA control signals that drive the selection switches 426 and selection switches 432 to perform a binary search for the value of the SA control signals that represent a digital value closest to the voltage acquired by the binary weighted capacitors 422 while S was set.

At 310, digitization is complete and the voltage on the top plates 452 of the binary weighted capacitors 428 is the same as the voltage on the top plate 444 of the sampling capacitor 442. The SA control signals are reset to open the selection switches 426 and the selection switches 432. The H control signal is set to open the isolation switch 436 and disconnect the top plate 444 of the sampling capacitor 442 from the top plates 452 of the binary weighted capacitors 428.

At 312, acquisition of a new sample of the input signal at the signal input terminal 106 is initiated by setting the S control signal to connect the bottom plates 454 of the binary weighted capacitors 422 and the top plate 444 of the sampling capacitor 442 to the signal input terminal 106, to connect the top plates 450 of the binary weighted capacitors 422 to ground, and to connect the bottom plates 456 of the binary weighted capacitors 428 to ground. As the S control signal is set, the voltage on the top plate 444 of the sampling capacitor 442 is presented to the signal input terminal 106 in addition to the voltage on the bottom plates 454 of the binary weighted capacitors 422 to provide kick-back linearization.

Figure 5:
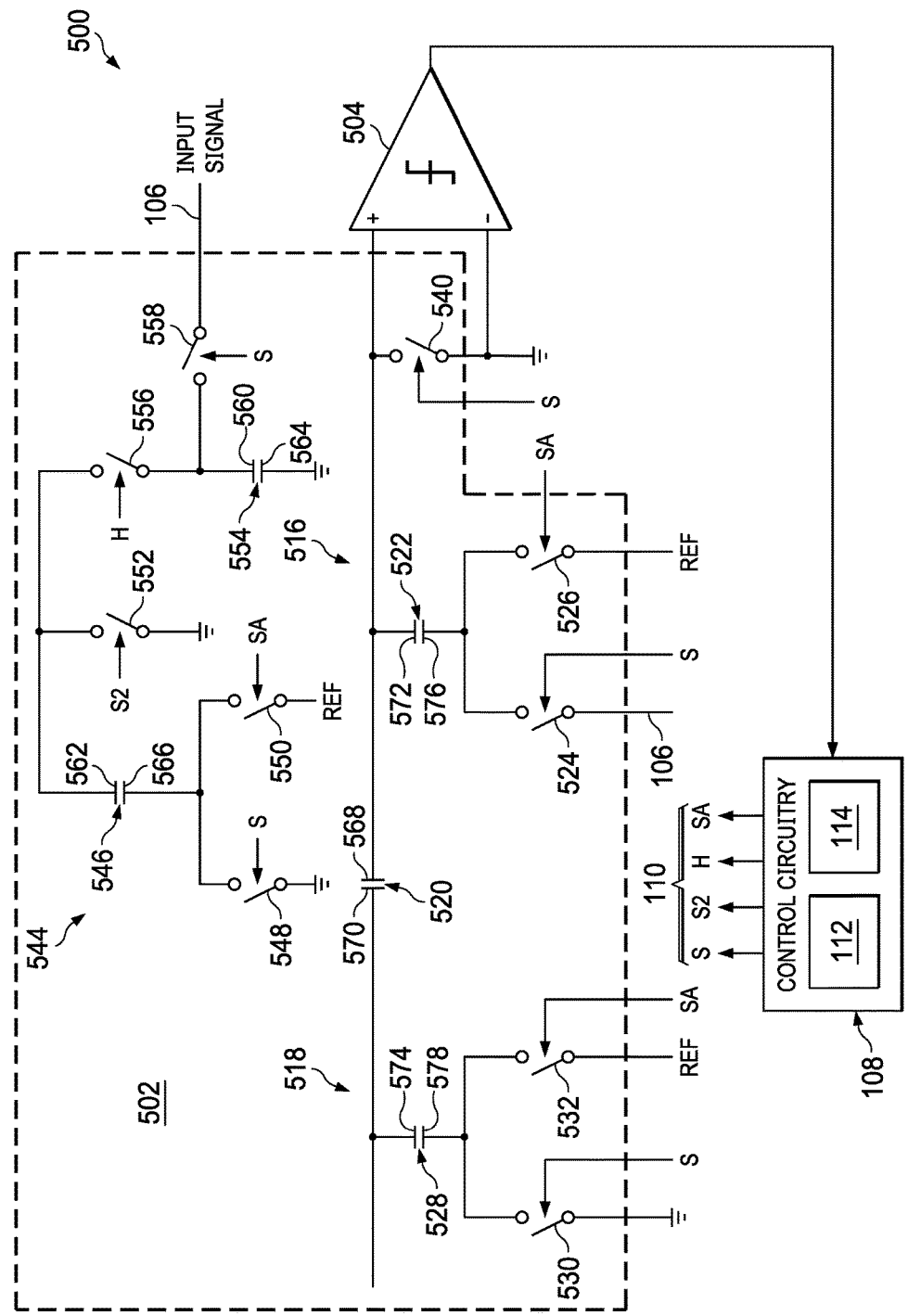
FIG. 5 shows a block diagram of a third example of a SAR ADC with improved kick-back linearity in accordance with the present disclosure.

FIG. 5 shows a block diagram of a third example of a SAR ADC 500 with improved kick-back linearity in accordance with the present disclosure. The SAR ADC 500 includes a CDAC 502, a comparator 504, a signal input terminal 106, and control circuitry 108. The SAR ADC 500 receives an input signal ($V_{IN}$) to be digitized via the signal input terminal 106. The comparator 504 compares the voltage output of the CDAC 502 to a reference voltage. The control circuitry 108 receives and applies the output of the comparator 504 to control the CDAC 502 for digitization of the input signal. The control circuitry 108 includes a SAR 112 and state machine circuitry 114. The state machine circuitry 114 generates control signals 110 that control the switches of the CDAC 502. The SAR ADC 500 is similar to the SAR ADC 100 and the SAR ADC 400, but in the SAR ADC 500, the LSB capacitor array 518 includes no additional components (e.g., switches or sampling capacitors) that might affect the linearity of the LSB capacitor array 518. Instead, the CDAC 502 includes an additional LSB capacitor array 544 that replicates the voltage at the bottom plate 570 of the coupling capacitor 520 at the end of digitization. Because the LSB capacitor array 518 includes additional components to provide kick-back compensation, the SAR ADC 500 may provide better linearity than the SAR ADC 100 or the SAR ADC 400.

The CDAC 502 includes an MSB capacitor array 516, the LSB capacitor array 518, the coupling capacitor 520, and the additional LSB capacitor array 544. The MSB capacitor array 516 includes a plurality of binary weighted capacitors 522, sampling switches 524, selection switches 526, and a top plate reset switch 540. The top plate reset switch 540 switchably connects the top plates 572 of the binary weighted capacitors 522 to ground. The top plate 568 of the coupling capacitor 520 is connected to the top plates 572 of the binary weighted capacitors 522. The bottom plate 570 of the coupling capacitor 520 is connected to the top plates 574 of the binary weighted capacitors 528. The capacitor array 200 shown in FIG. 2 is an implementation of the binary weighted capacitors 522, the sampling switches 524 and the selection switches 526.

The LSB capacitor array 518 includes a plurality of binary weighted capacitors 528, sampling switches 530, and selection switches 532. The capacitor array 200, shown in FIG. 2, is an implementation of the binary weighted capacitors 528, the sampling switches 530, and the selection switches 532.

The additional LSB capacitor array 544 is similar to the LSB capacitor array 418 of the SAR ADC 400. The additional LSB capacitor array 544 includes a plurality of binary weighted capacitors 546, sampling switches 548, selection switches 550, a top plate reset switch 552, a sampling capacitor 554, an isolation switch 556, and an input connection switch 558. The top plate reset switch 552 switchably connects the top plates 562 of the binary weighted capacitors 546, and the top plate 560 of the sampling capacitor 554, to ground. The isolation switch 556 switchably connects the top plate 560 of the sampling capacitor 554 to the top plates 562 of the binary weighted capacitors 546. The input connection switch 558 switchably connects the top plate 560 of the sampling capacitor 554 to the signal input terminal 106. The bottom plate 564 of the sampling capacitor 554 is connected to ground. The capacitance of the sampling capacitor 554 is the same as, or is proportional to, the capacitance of the coupling capacitor 520 in some implementations.

The control signals 110 generated by the control circuitry 108 include sampling (S) control signal, sampling (S2) control signal, hold (H) control signal, and successive approximation (SA) control signals. The S control signal controls the switching of the sampling switches 524, the top plate reset switch 540, the sampling switches 530, the sampling switches 548, and the input connection switch 558. The S2 control signal controls the switching of the top plate reset switch 552, the H control signal controls the switching of the isolation switch 556, and the SA control signals control the switching of the selection switches 526, the selection switches 532, and the selection switches 550. To acquire a sample of the input signal present at the signal input terminal 106, the control circuitry 108 opens the selection switches 526, the selection switches 532, the selection switches 550, and the isolation switch 556, and closes the sampling switches 524, the sampling switches 530, the sampling switches 548, the top plate reset switch 552, and the input connection switch 558. Closing the sampling switches 548 connects the bottom plates 566 of the binary weighted capacitors 546 to ground. Closing the sampling switches 524 connects the bottom plates 576 of the binary weighted capacitors 522 to the signal input terminal 106. Closing the input connection switch 558 connects the top plate 560 of the sampling capacitor 554 to the signal input terminal 106. Thus, during sampling of the input signal at the signal input terminal 106, the voltage on the bottom plates 576 of the binary weighted capacitors 522 and the voltage on the top plate 560 of the sampling capacitor 554 is connected to the signal input terminal 106. The voltage on the top plate 560 of the sampling capacitor 554 ($V_{IN}$-$V_{MSB}$) compensates for the voltage on the bottom plates 576 of the binary weighted capacitors 522 ($V_{MSB}$) to linearize the kick-back presented to the signal input terminal 106 during sampling.

Referring again to FIG. 3, the operation of the SAR ADC 500 is now described. At 302, the H control signal is already reset to disconnect the binary weighted capacitors 546 from the sampling capacitor 554, and the S control signal is set to connect the bottom plates 576 of the binary weighted capacitors 522 and the top plate 560 of the sampling capacitor 554 to the signal input terminal 106, to connect the top plates 572 of the binary weighted capacitors 522 to ground, and to connect the bottom plates 578 of the binary weighted capacitors 528 and the binary weighted capacitors 546 to ground. The S2 control signal is set to connect the top plates 562 of the binary weighted capacitors 546 to ground. While S is set, the binary weighted capacitors 522 acquire a sample of the input signal at the signal input terminal 106, and the binary weighted capacitors 546 are discharged.

At 304, the S control signal is reset to disconnect the bottom plates 576 of the binary weighted capacitors 522 and the top plate 560 of the sampling capacitor 554 from the signal input terminal 106, to disconnect the top plates 572 of the binary weighted capacitors 522 from ground, and to disconnect the bottom plates 578 of the binary weighted capacitors 528 and the binary weighted capacitors 546 from ground. The charge on the binary weighted capacitors 522 is representative of the input signal at the signal input terminal 106.

At 306, the H control signal is set to connect the top plates 562 of the binary weighted capacitors 546 to the top plate 560 of the sampling capacitor 554. At 306, the S2 control signal remains set, and the top plate 560 of the sampling capacitor 554 is connected to ground via the isolation switch 556 and the top plate reset switch 552.

At 308, the S2 control signal is reset to disconnect the top plates 562 of the binary weighted capacitors 546 and the sampling capacitor 554 from ground. While the H control signal remains set, the control circuitry 108 successively sets the SA control signals that drive the selection switches 526, the selection switches 432, and the selection switches 550 to perform a binary search for the value of the SA control signals that represent a digital value closest to the voltage acquired by the binary weighted capacitors 522 while S was set.

At 310, digitization is complete and the voltage on the top plates 562 of the binary weighted capacitors 546 is the same as the voltage on the top plate 560 of the sampling capacitor 554. The SA control signals are reset to open the sampling switches 524, the selection switches 532, and the selection switches 550. The H control signal is set to open the isolation switch 556 and disconnect the top plate 560 of the sampling capacitor 554 from the top plates 562 of the binary weighted capacitors 546.

At 312, acquisition of a new sample of the input signal at the signal input terminal 106 is initiated by setting the S control signal to connect the bottom plates 576 of the binary weighted capacitors 522 and the top plate 560 of the sampling capacitor 554 to the signal input terminal 106, to connect the top plates 572 of the binary weighted capacitors 522 to ground, and to connect the bottom plates 578 of the binary weighted capacitors 528 and the binary weighted capacitors 546 to ground. As the S control signal is set, the voltage on the top plate 560 of the sampling capacitor 554 is presented to the signal input terminal 106 in addition to the voltage on the bottom plates 576 of the binary weighted capacitors 522 to provide kick-back linearization.

The above discussion is meant to be illustrative of the principles and various examples of the present invention. Numerous variations and modifications will become apparent to those skilled in the art once the above disclosure is fully appreciated. It is intended that the following claims be interpreted to embrace all such variations and modifications.

What is claimed is:

1. A successive approximation register (SAR) analog-to-digital converter (ADC), comprising:
   a signal input terminal configured to receive a signal to be digitized;
   a capacitive digital-to-analog converter, comprising:
      a first capacitor array comprising a plurality of capacitors;
      a second capacitor array comprising a plurality of capacitors;
      a coupling capacitor that connects the first capacitor array to the second capacitor array, the coupling capacitor comprising:
         a top plate connected to a top plate of each of the capacitors of the first capacitor array; and
         a bottom plate coupled to a top plate of each of the capacitors of the second capacitor array;
      a first switch configured to switchably connect a bottom plate of each of the capacitors of the first capacitor array to the signal input terminal; and
   a second switch configured to conduct a voltage on the bottom plate of the coupling capacitor to the signal input terminal.

2. The SAR ADC of claim 1, further comprising control circuitry configured to generate signals for controlling the first switch and the second switch; wherein the signals comprise a sampling control signal to coincidently close the first switch and the second switch.

3. The SAR ADC of claim 1, further comprising a sampling capacitor comprising a top plate coupled to the bottom plate of the coupling capacitor, wherein the second switch is connected to the top plate of the sampling capacitor.

4. The SAR ADC of claim 3, further comprising a third switch configured to switchably connect the top plate of the sampling capacitor to the bottom plate of the coupling capacitor.

5. The SAR ADC of claim 1, wherein the second switch is connected to the bottom plate of the coupling capacitor.

6. The SAR ADC of claim 5, further comprising a third switch configured to switchably connect the bottom plate of the coupling capacitor to the top plate of each of the capacitors of the second capacitor array.

7. The SAR ADC of claim 1, further comprising a third switch configured to switchably connect the bottom plate of the coupling capacitor and the top plate of each of the capacitors of the second capacitor array to ground.

8. The SAR ADC of claim 7, further comprising control circuitry configured to generate signals for controlling the first switch, second switch, and the third switch; wherein the signals comprise:
   a first sampling control signal to coincidently close the first switch and the second switch to sample signal to be digitized; and
   a second sampling control signal to close the third switch while the first switch is closed and for an interval after the first switch is opened.

9. The SAR ADC of claim 1, further comprising:
   a third capacitor array comprising a plurality of capacitors;
   a sampling capacitor comprising:
      a top plate coupled to:
         a top plate of each capacitor of the third capacitor array; and
         the second switch;
      a bottom plate coupled to ground;
   a third switch configured to switchably connect the top plate of the sampling capacitor to the top plate of each capacitor of the third capacitor array.

10. The SAR ADC of claim 9, further comprising:
    a fourth switch configured to switchably connect the top plate of the sampling capacitor and the top plate of each capacitor of the third capacitor array to ground;
    a fifth switch configured to switchably connect the bottom plate of each capacitor of the third capacitor array to ground.

11. A successive approximation register (SAR) analog-to-digital converter (ADC), comprising:
    a signal input terminal configured to receive a signal to be digitized;
    a capacitive digital-to-analog converter, comprising:
    a first capacitor array comprising a plurality of capacitors;
    a second capacitor array comprising a plurality of capacitors;
    a coupling capacitor that connects the first capacitor array to the second capacitor array, the coupling capacitor comprising: a top plate connected to a top plate of each of the capacitors of the first capacitor array; and a bottom plate connected to a top plate of each of the capacitors of the second capacitor array;
    a first switch configured to switchably connect a bottom plate of each of the capacitors of the first capacitor array to the signal input terminal;

a second switch configured to switchably connect the bottom plate of the coupling capacitor and the top plate of each of the capacitors of the second capacitor array to ground;
a third switch configured to switchably connect the bottom plate of the coupling capacitor to the signal input terminal; and
a fourth switch configured to switchably connect the bottom plate of the coupling capacitor to the second switch.

12. The SAR ADC of claim 11, further comprising control circuitry configured to:
close the second switch concurrently with the first switch and maintain closure of the second switch for an interval after the first switch is opened;
close the fourth switch after the first switch is opened, and open the fourth switch before the first switch is closed; and
close the third switch concurrently with closing the first switch, and open the third switch concurrently with opening the first switch.

13. A successive approximation register (SAR) analog-to-digital converter (ADC), comprising:
a signal input terminal configured to receive a signal to be digitized; a capacitive digital-to-analog converter, comprising:
a first capacitor array comprising a plurality of capacitors;
a second capacitor array comprising a plurality of capacitors;
a coupling capacitor that connects the first capacitor array to the second capacitor array, the coupling capacitor comprising: a top plate connected to a top plate of each of the capacitors of the first capacitor array; and a bottom plate connected to a top plate of each of the capacitors of the second capacitor array;
a first switch configured to switchably connect a bottom plate of each of the capacitors of the first capacitor array to the signal input terminal;
a second switch configured to switchably connect the bottom plate of the coupling capacitor and the top plate of each of the capacitors of the second capacitor array to ground;
a sampling capacitor coupled to the bottom plate of the coupling capacitor;
a third switch configured to switchably connect a top plate of the sampling capacitor to the signal input terminal; and
a fourth switch configured to switchably connect the top plate of the sampling capacitor to the second switch.

14. The SAR ADC of claim 13, further comprising control circuitry configured to:
close the second switch concurrently with the first switch and maintain closure of the second switch for an interval after the first switch is opened;
close the fourth switch after the first switch is opened, and open the fourth switch before the first switch is closed; and
close the third switch concurrently with closing the first switch, and open the third switch concurrently with opening the first switch.

15. A successive approximation register (SAR) analog-to-digital converter (ADC), comprising:
a signal input terminal configured to receive a signal to be digitized;
a capacitive digital-to-analog converter, comprising:
a first capacitor array comprising a plurality of capacitors, wherein the plurality of capacitors are binary weighted to represent most significant bits of a digital value;
a second capacitor array comprising a plurality of capacitors, wherein the plurality of capacitors are binary weighted to represent least significant bits of the digital value;
a first switch configured to switchably connect a bottom plate of each of the capacitors of the first capacitor array to the signal input terminal; and
a second switch configured to conduct a voltage on a top plate of each of the capacitors of the second capacitor array to the signal input terminal.

16. The SAR ADC of claim 15, further comprising:
a coupling capacitor that connects the first capacitor array to the second capacitor array, the coupling capacitor comprising:
a top plate connected to a top plate of each of the capacitors of the first capacitor array; and
a bottom plate coupled to a top plate of each of the capacitors of the second capacitor array;
a third switch configured to switchably connect the bottom plate of the coupling capacitor to the top plate of each of the capacitors of the second capacitor array; and
a fourth switch configured to switchably connect the bottom plate of the coupling capacitor and the top plate of each of the capacitors of the second capacitor array to ground.

17. The SAR ADC of claim 15, further comprising:
a coupling capacitor that connects the first capacitor array to the second capacitor array, the coupling capacitor comprising:
a top plate connected to a top plate of each of the capacitors of the first capacitor array; and
a bottom plate connected to a top plate of each of the capacitors of the second capacitor array;
a sampling capacitor comprising a top plate coupled to the bottom plate of the coupling capacitor, wherein the second switch is connected to the top plate of the sampling capacitor;
a third switch configured to switchably connect the bottom plate of the coupling capacitor to the top plate of the sampling capacitor; and
a fourth switch configured to switchably connect the bottom plate of the coupling capacitor, the top plate of the sampling capacitor, and the top plate of each of the capacitors of the second capacitor array to ground.

18. The SAR ADC of claim 15, further comprising:
a third capacitor array comprising a plurality of capacitors, wherein the plurality of capacitors are binary weighted to represent the least significant bits of the digital value;
a coupling capacitor that connects the first capacitor array to the third capacitor array, the coupling capacitor comprising:
a top plate connected to a top plate of each of the capacitors of the first capacitor array; and
a bottom plate connected to a top plate of each of the capacitors of the third capacitor array.

19. The SAR ADC of claim 18, further comprising:
a sampling capacitor coupled to the top plate of each capacitor of the second capacitor array, the sampling capacitor comprising a top plate connected to the second switch;

a third switch configured to switchably connect the top plate of the sampling capacitor to the top plate of each capacitor of the second capacitor array; and
a fourth switch configured to switchably connect the top plate of the sampling capacitor and the top plate of each capacitor of the second capacitor array to ground.

* * * * *